United States Patent
Kim et al.

(10) Patent No.: US 6,236,616 B1
(45) Date of Patent: May 22, 2001

(54) SEMICONDUCTOR MEMORY DEVICE HAVING DATA INPUT/OUTPUT LINE SHARED BY A PLURALITY OF BANKS

(75) Inventors: Su-a Kim, Seoul; Hi-choon Lee, Sungnam, both of (KR)

(73) Assignee: Samsung Electronics, Co., LTD (KR)

( * ) Notice: Subject to any disclaimer, the term of this patent is extended or adjusted under 35 U.S.C. 154(b) by 0 days.

(21) Appl. No.: 09/513,713

(22) Filed: Feb. 25, 2000

(30) Foreign Application Priority Data

Mar. 22, 1999 (KR) .................................................. 99-9654
Aug. 5, 1999 (KR) ................................................. 99-32147

(51) Int. Cl.[7] ................................. G11C 8/00; G11C 7/00
(52) U.S. Cl. ................................. 365/230.03; 365/189.02
(58) Field of Search ..................... 365/230.03, 230.02, 365/51, 63, 230.04, 189.02

(56) References Cited

U.S. PATENT DOCUMENTS 5,617,555 * 4/1997 Patel et al. ....................... 365/230.03
5,657,265 * 8/1997 Yoo et al. ................................ 365/63
6,091,659 * 7/2000 Watanabe et al. .............. 365/230.03

* cited by examiner

*Primary Examiner*—Son Mai
(74) *Attorney, Agent, or Firm*—Mills & Onello, LLP

(57) ABSTRACT

A semiconductor memory device having a structure in which a data input/output line is shared by a plurality of banks is provided. In the semiconductor memory device which has a memory block including a plurality of banks, data of a selected memory cell is input or output via a data input/output line. When data is written to a memory cell, the memory block is divided into at least two bank groups and the data input/output line is divided into at least two data input/output lines to separately connect the data input/output line to the respective bank groups so that the data is written to the selected memory cell via the data input/output line connected to a bank group including the selected memory cell. When data of a selected memory cell is read, the local data input/output lines are connected. Therefore, reduction of speed and power consumption is minimized and loads of data input/output lines are regulated during the read and write operations.

17 Claims, 9 Drawing Sheets

SEMICONDUCTOR MEMORY DEVICE HAVING DATA INPUT/OUTPUT LINE SHARED BY A PLURALITY OF BANKS

BACKGROUND OF THE INVENTION

1. Field of the Invention

The present invention relates to a semiconductor integrated circuit, and more particularly, to a semiconductor memory device having a structure in which a data input/output line is shared by a plurality of banks.

2. Description of the Related Art

Generally, in addition to improvement in the operation speed of a central processing unit (CPU), improvement in performance of a memory device for storing data and programs requested by the CPU enhances the performance of a computer system. The amount of input/output data transmitted per unit of time, i.e., bandwidth, must be increased to improve the performance of the memory. The amount of input/output data can be increased by increasing the number of input/output data bits or the access speed.

One representative memory device is a Rambus DRAM (RDRAM). The amount of data read from or written to the RDRAM at one time is directly influenced by the number of input/output lines and defined by a data input/output rule such as ×16 or ×18. When the RDRAM operates at a speed of 400 MHz, data of 2 bytes is transmitted in 1.25 ns (800 MHz) so that a total of 16 bytes of data is transmitted in four cycles externally. Internally, the RDRAM performs an input/output operation of ×128 or ×144 bits at one time at a speed of 100 MHz. Accordingly, data of memory cell bit lines corresponding to the data input/output lines of ×128 or ×144 is selectively transmitted to the data input/output lines via input/output control circuits.

FIG. 1 shows a part of a conventional semiconductor memory device having a bank and an input/output control circuit which controls the bank. Referring to FIG. 1, an input/output control circuit 20 selects one bit line among m×n bit line pairs BL in a bank 10 and transmits data of the selected bit line to a data input/output line I/O.

The input/output control circuit 20 includes n m:1 column selectors 30 and a single n:1 column selector 40. The m:1 column selector 30 selects one bit line among m bit line pairs in response to a first column selection signal CSLFi (i=0–m–1) applied to a first selection gate TFi (i=0–m–1). The selected bit line is connected to the n:1 column selector 40. The n:1 column selector 40 selects one among the n outputs transmitted from the n m:1 column selectors 30 in response to a second column selection signal CSLSj (j=0–n–1) applied to a second column selection gate TSj (j=0–n–1) and transmits the selected output to the input/output line I/O.

In the input/output control circuit 20, junction loads on the single input/output line I/O exist in the n second column selection gates TSj (j=0–n–1) and in the m first selection gates TFi (i=0–m–1) connected to a selected second column selection gate TSj (j=0–n–1). The single input/output line I/O is shared by a plurality of banks as shown in FIG. 2.

Referring to FIG. 2, in a memory block DQO, a single input/output line I/O is shared by a plurality of banks 10 through 17 and cell bit lines in the banks 10 through 17 are respectively connected to the input/output line I/O through input/output control circuits 20 through 27. Accordingly, a load on the single input/output line I/O in the memory block DQO is obtained by multiplying the sum of the junction loads of the n second column selection gates TSj (j=0–n–1) and the junction loads of the m first column selection gates TFi (i=0–m–1) by the number of banks sharing the input/output line I/O, that is, the load on the single input/output line I/O is expressed as a junction load of (m+n)×number of banks. An input/output line I/O having such a large junction load has a problem of slow operation speed and causes power consumption when writing data to memory cells in banks.

SUMMARY OF THE INVENTION

It is an object of the present invention to provide a semiconductor memory device for minimizing power consumption and implementing high speed operation when writing data to memory cells by minimizing a load on an input/output line.

In one embodiment, a semiconductor memory device according to the invention has a memory block including a plurality of banks. In the semiconductor memory device, data of a selected memory cell is input or output via a data input/output line. The memory block is divided into at least two bank groups during a write operation. The data input/output line is divided into at least two local data input/output lines respectively connected to the at least two bank groups, while data is written to the memory cell via a local data input/output line connected to a bank group including the selected memory cell.

In one embodiment, the local data input/output lines are connected to each other while the data is read from the memory cell. Also, the banks of the memory block are grouped by a predetermined memory address.

In another embodiment of the present invention, a semiconductor memory device has at least two memory blocks each comprising a plurality of banks. In the semiconductor memory device, data of a selected memory cell in each memory block is input or output via a data input/output line, and bit lines of at least two banks selected from the plurality of banks in different memory blocks are respectively connected to the data input/output line. The semiconductor memory device includes a switch in each memory block for dividing a memory block into upper and lower bank groups and dividing the data input/output line into upper and lower data input/output lines to separately connect the upper and lower data input/output lines to the respective upper and lower bank groups during write operation, and for connecting the upper and lower data input/output lines to allow the banks in the corresponding memory block to share the data input/output line during read operation. The semiconductor memory device also includes an upper write driver in each memory block for applying write data to a corresponding upper data input/output line connected to a corresponding upper bank group when a memory cell of the upper bank group is selected during the write operation, and a lower write driver for applying the write data to a corresponding lower data input/output line connected to a corresponding lower bank group when a memory cell of the lower bank group is selected during the write operation. In one embodiment, the selected banks belong to different bank groups in different memory blocks.

In one embodiment, the write data is applied to the upper data input/output line via an auxiliary data input/output line by the upper write driver when writing the data in the memory cell in the upper bank group, and write data is applied to the lower data input/output line by the lower write driver when writing data to the memory cell in the lower bank group, whereby the write data is written in the memory cell in the corresponding bank group.

In one embodiment, the switch includes an upper data input/output line selector for applying write data from the upper write driver to the upper data input/output line in response to a write driver enable signal during the write operation. The switch also includes an upper/lower data input/output line connector for disconnecting the lower data input/output line from the upper data input/output line in response to the write driver enable signal during the write operation and connecting the lower data input/output line to the upper data input/output line in response to a write driver enable signal during the read operation.

The upper write driver can apply write data to the upper data input/output line through the switch in response to a write driver enable signal instructing the write operation and a signal for selecting the upper bank group. The lower write driver can apply write data to the lower data input/output line through the switch in response to a write driver enable signal instructing the write operation and a signal for selecting the lower bank group.

In yet another embodiment of the present invention, a semiconductor memory device has a memory block including a plurality of banks. In the semiconductor memory device, data of a selected memory cell is input or output via a data input/output line. The memory block is divided into at least two bank groups and the data input/output line is divided into at least two local data input/output lines respectively connected to the at least two bank groups, whereby data is written to or read from a memory cell via a local data input/output line connected to a bank group including the selected memory cell.

In still another embodiment of the present invention, a semiconductor memory device has at least two memory blocks each comprising a plurality of banks. In the semiconductor memory device, data of a selected memory cell in each memory block is input or output via a data input/output line, and predetermined bit lines of at least two banks selected from the plurality of banks in different memory blocks are respectively connected to at least two data input/output lines. The memory block is divided into at least two upper and lower bank groups and the data input/output line is divided into at least two upper and lower data input/output lines respectively connected to the upper and lower bank groups, whereby data is written to or read from a selected memory cell via the upper and lower data input/output lines connected to a bank group including the selected memory cell. The selected banks belong to different bank groups in different memory blocks in the semiconductor memory device.

According to the present invention, a data input/output line is divided into upper and lower data input/output lines respectively connected to corresponding bank groups so that a junction load and a line load are reduced by one half compared with a conventional data input/output line. Since read and write operations are performed via the upper and lower data input/output lines, each of which has a small load, reduction of speed and power consumption can be minimized. Moreover, in a structure having at least two memory blocks, memory cells selected by the same address belong to different bank groups so that the load of a data input/output line can be regulated to some extent, thereby preventing power supply noise.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DESCRIPTION OF THE PREFERRED EMBODIMENTS

The present invention now will be described more fully with reference to the accompanying drawings, in which preferred embodiments of the invention are shown. In a Rambus DRAM (RDRAM), a plurality of banks are aligned in a row direction, and memory blocks called DQ blocks, which are respectively connected to data input/output lines, are formed in the column direction of the banks. The number of data input/output lines varies depending on the memory architecture of the RDRAM. In the embodiments of the present invention described herein, for illustrative purposes, it is assumed that one data input/output line IO and IOB is used. It is described herein in detail how the data input/output line IO and IOB is divided and connected during write and read operations.

Figure 3:
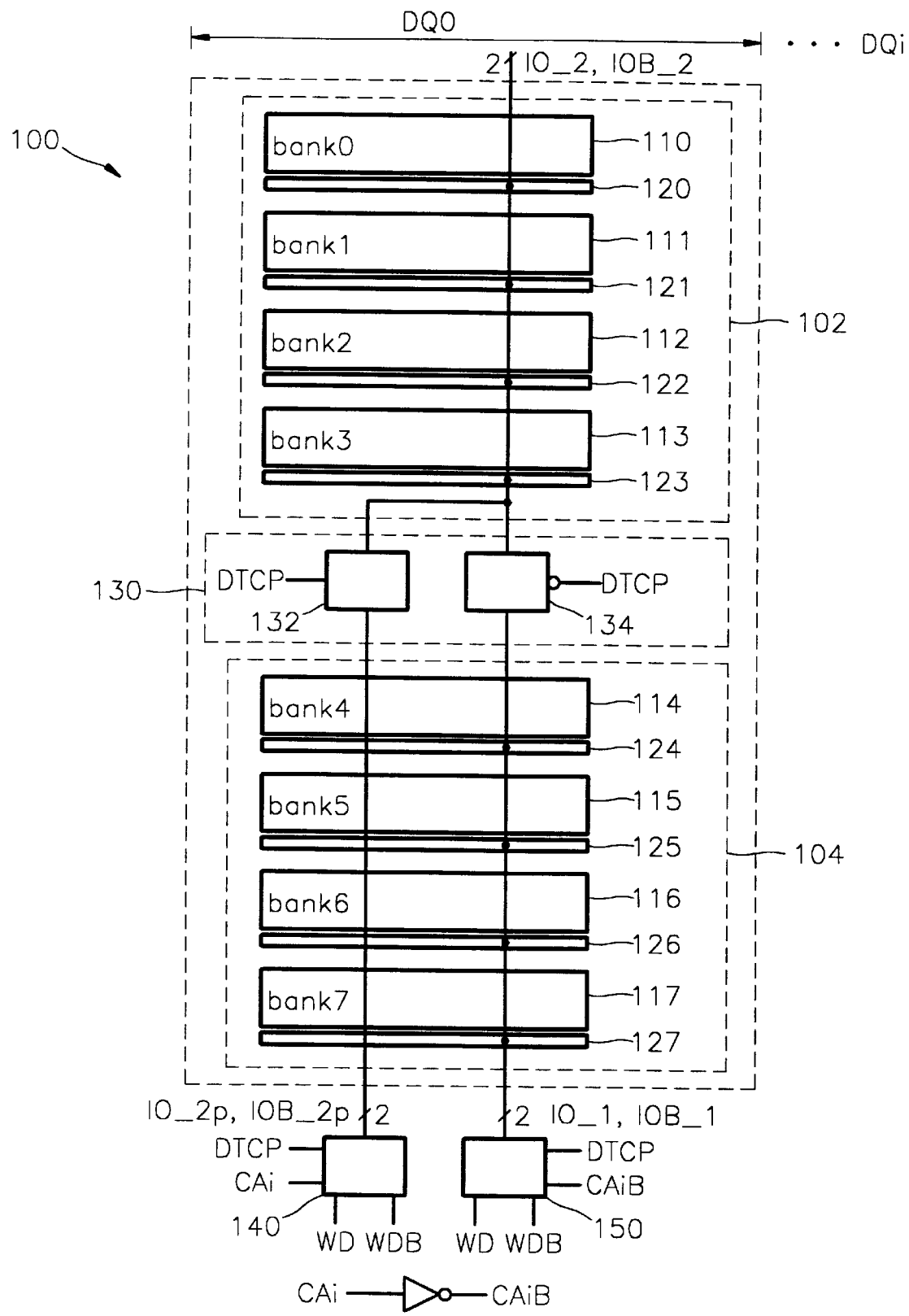
FIG. 3 contains a schematic diagram which illustrates a semiconductor memory device having a data input/output line structure according to a first embodiment of the present invention.

FIG. 3 illustrates a first embodiment of a semiconductor memory device according to the present invention. Referring to FIG. 3, a semiconductor memory device 100 has a plurality of DQ blocks DQO through DQi, and each DQ block includes a plurality of banks 110 through 117. Data of a selected memory cell is input and output via a data input/output line IO and IOB.

For convenience' sake, in this embodiment of the semiconductor memory device 100, the banks 110 through 117 within one DQ block DQO, are grouped into two bank groups 102 and 104 by a predetermined address CAi and CAiB. That is, the banks are grouped into the upper bank group 102 and the lower bank group 104. The data input/output line IO and IOB is divided into two data input/output lines, an upper data input/output line IO_2 and IOB_2 and a lower data input/output line IO_1 and IOB_1 to separately connect the data input/output line IO and IOB to respective bank groups 102 and 104. The upper data input/output line IO_2 and IOB_2 is connected to an auxiliary data input/output line IO_2p and IOB_2p during write operation. It will be understood that a plurality of banks in a memory block defined in accordance with the present invention may be grouped into more than two groups and a data input/output line may be divided into more than two data input/output lines to separately connect the data input/output line to more than two respective bank groups.

Figure 1:
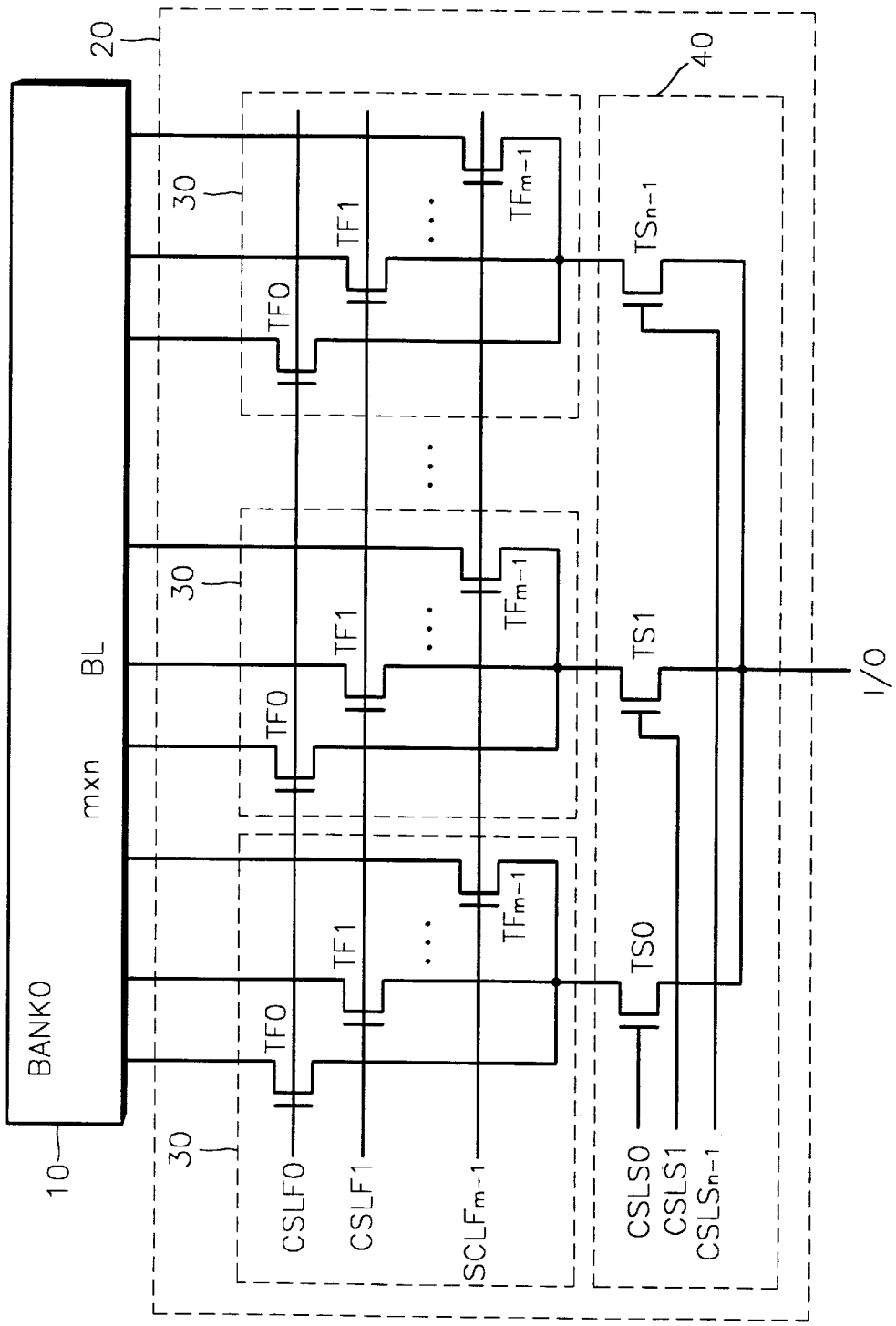
FIG. 1 contains a schematic diagram which illustrates a portion of a conventional semiconductor memory device having a bank and an input/output control circuit which controls the bank.

The semiconductor memory device 100 includes the upper bank group 102, the lower bank group 104, a switch 130, an upper write driver 140 and a lower write driver 150. The upper bank group 102 includes upper banks 110 through 113 and input/output control circuits 120 through 123 which are respectively connected to the upper banks to select memory cells within the upper banks 110 through 113. Each of the input/output control circuits 120 through 123 corresponds to the general input/output control circuit as described in FIG. 1. Briefly, one bit line among m×n cell bit line pairs in a selected bank among the upper banks 110 through 113 is selected and data is written to or read from a memory cell connected to the selected bit line via the input/output control circuits 120 through 123.

The lower bank group 104 includes lower banks 114 through 117 and input/output control circuits 124 through 127 which are respectively connected to the lower banks to select memory cells within the lower banks 114 through 117. One bit line among m×n cell bit line pairs in a selected bank among the lower banks 114 through 117 is selected and data is written to or read from a memory cell connected to the selected bit line via the input/output control circuits 124 through 127.

The switch 130 divides the data input/output line IO and IOB into the upper data input/output line IO_2 and IOB_2 and the lower data input/output line IO_1 and IOB_1 to separately connect the upper data input/output line IO_2 and IOB_2 or lower data input/output line IO_1 and IOB_1 to a bank group including a memory cell to be written to when writing data to the memory cell in the DQ block DQ0. Also, the switch 130 connects the upper data input/output line IO_2 and IOB_2 to the lower data input/output line IO_1 and IOB_1 to allow all the banks 110 through 117 to share the data input/output line IO_2, IOB_2, IO_1 and IOB_1 when reading data from a memory cell in the DQ0 block.

Figure 4:
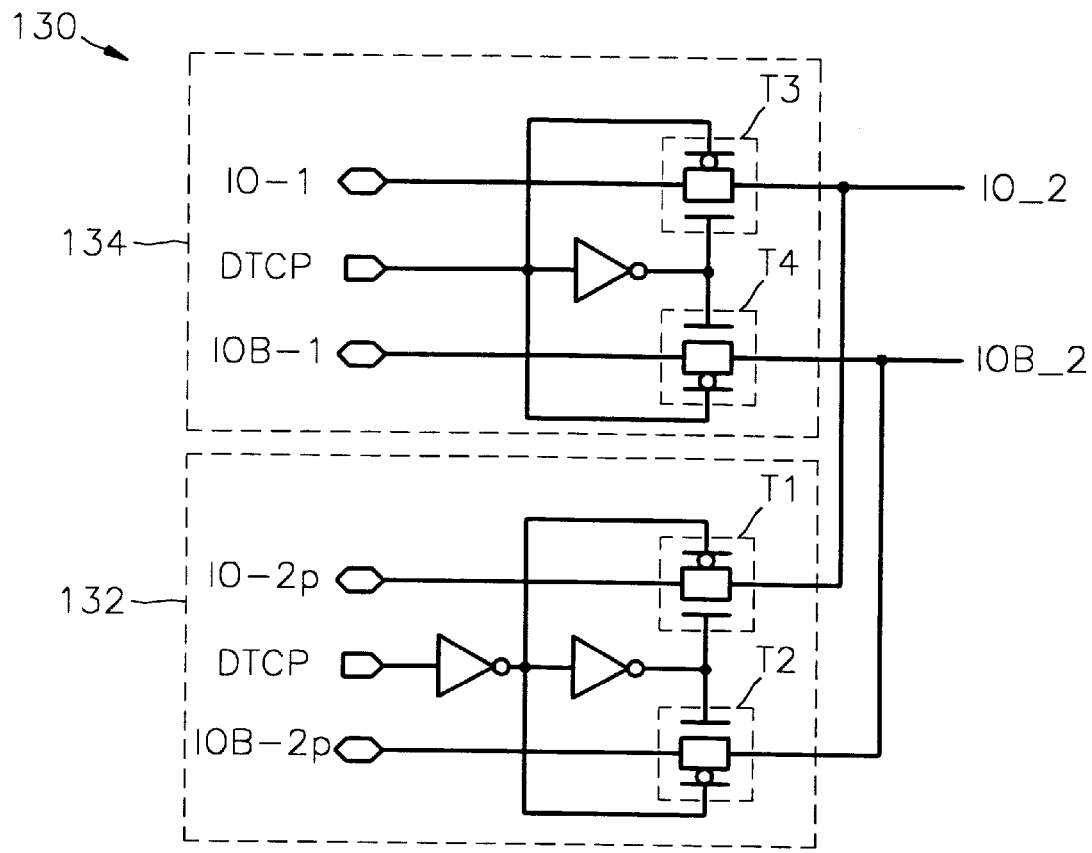
FIG. 4 contains a schematic diagram which illustrates one embodiment of a switch shown in FIG. 3.

Referring to FIG. 4, the switch 130 comprises an upper data input/output line selector 132 and an upper/lower data input/output line connector 134. During a write operation, the upper/lower data input/output line connector 134 divides the data input/output line IO and lOB into the upper data input/output line IO_2 and IOB_2 and the lower data input/output line IO_1 and IOB_1 in response to a write driver enable signal DTCP activated in response to a write instruction. Specifically, in the upper/lower data input/output line connector 134, transmission gates T3 and T4 are turned off in response to the activation of the write driver enable signal DTCP to a logic high level so that the data input/output line IO and IOB is divided into the upper data input/output line IO_2 and IOB_2 and the lower data input/output line IO_1 and IO_1. In the upper data input/output line selector 132, transmission gates T1 and T2 are turned on in response to the activation of the write driver enable signal DTCP to the logic high level so that the auxiliary data input/output line IO_2p and IOB_2p connected to the upper write driver 140 of FIG. 3 is connected to the upper data input/output line IO_2 and IOB_2.

During the read operation, the upper/lower data input/output line connector 134 connects the upper data input/output line IO_2 and IOB_2 to the lower data input/output line IO_1 and IOB_1 in response to the deactivation of the write driver enable signal DTCP. Specifically, in the upper/lower data input/output line connector 134, the transmission gates T3 and T4 are turned on in response to the deactivation of the write driver enable signal DTCP to a logic low level so that the upper data input/output line IO_2 and IOB_2 is connected to the lower data input/output line IO_1 and IOB_1. In the upper data input/output line selector 132, the transmission gates T1 and T2 are turned off in response to the deactivation of the write driver enable signal DTCP to the logic low level so that the auxiliary data input/output line IO_2p and IOB_2p connected to the upper write driver 140 of FIG. 3 is disconnected from the upper data input/output line IO_2 and IOB_2.

Figure 5:
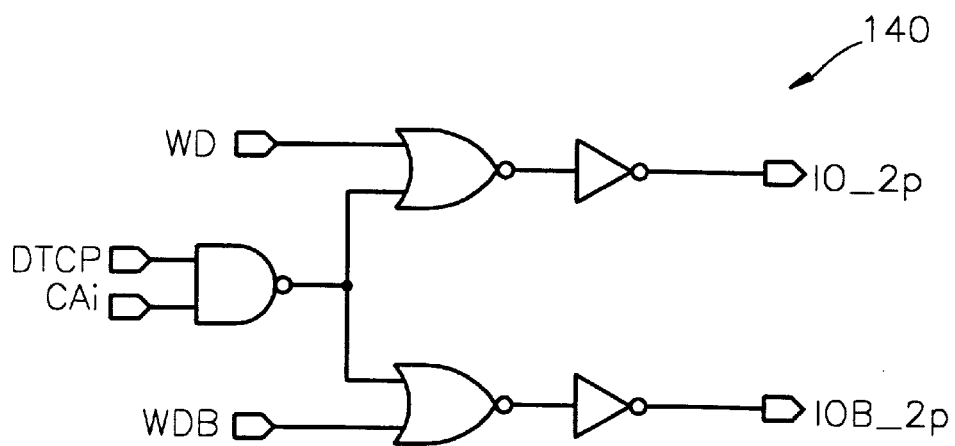
FIG. 5 contains a schematic diagram which illustrates one embodiment of an upper write driver shown in FIG. 3.

Referring to FIG. 5, when a memory cell in the upper bank group 102 of FIG. 3 is selected during the write operation, the upper write driver 140 applies write data WD and WDB to the upper input/output line IO_2 and IOB_2. The write data WD and WDB is provided by a data input buffer (not shown) which receives input data to be written to a memory cell.

Specifically, the upper write driver 140 applies the write data WD and WDB to the auxiliary data input/output line IO_2p and IOB_2p in response to the activation of the write driver enable signal DTCP to a logic high level and the activation of the signal CAi for selecting the upper bank group 102 to a logic high level. The data applied to the auxiliary data input/output line IO_2p and IO_2p is transmitted to the switch 130 of FIG. 3 and then applied to the upper data input/output line IO_2 and IOB_2 via the upper data input/output line selector 132 of FIG. 4 in the switch 130 of FIG. 3. Thus, the write data WD and WDB is written to a memory cell connected to a bit line selected through the input/output control circuits 120 through 123 of FIG. 3 in the upper bank group 102.

During the read operation, the upper write driver 140 sets the auxiliary data input/output line IO_2p and IOB_2p to a logic high level in response to the deactivation of the write driver enable signal DTCP to a logic low level. Thus, the write data WD and WDB is not applied to the auxiliary data input/output line IO_2p and IOB_2p.

Figure 6:
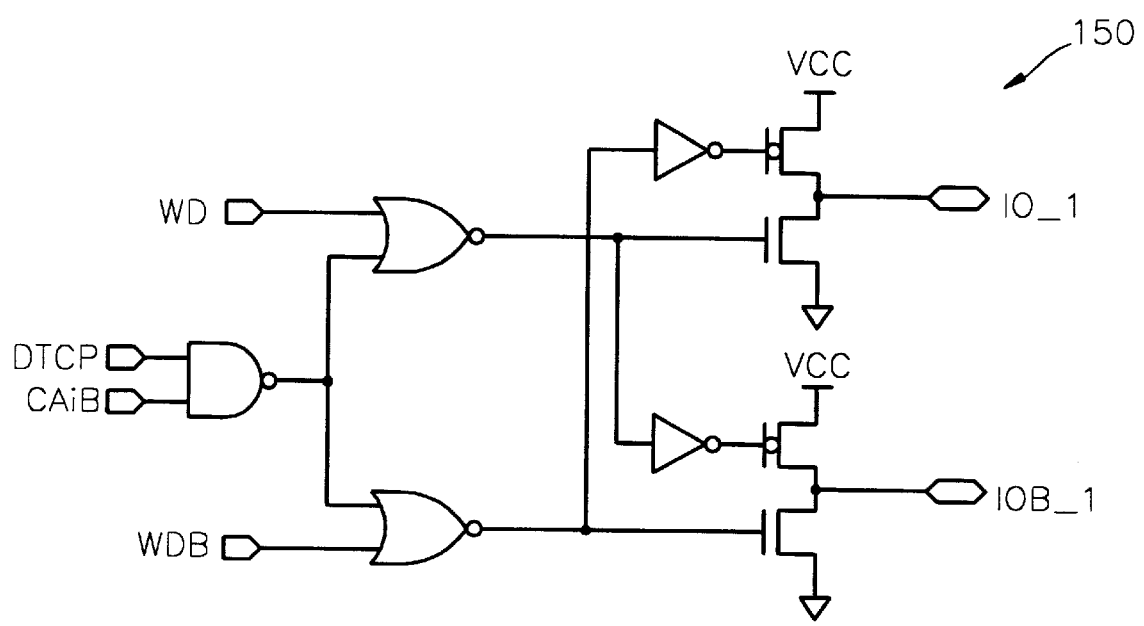
FIG. 6 contains a schematic diagram which illustrates one embodiment of a lower write driver shown FIG. 3.

Referring to FIG. 6, when a memory cell in the lower bank group 104 is selected during the write operation, the lower write driver 150 applies the write data WD and WDB to the lower input/output line IO_1 and IOB_1. Specifically, the lower write driver 150 applies the write data WD and WDB to the lower data input/output line IO_1 and IO_1 in response to the activation of the write driver enable signal DTCP to a logic high level and the activation of the signal CAiB for selecting the lower bank group 104 to a logic high level.

During the read operation, the lower write driver 150 sets the lower data input/output line IO_1 and IOB_1 to a high impedence state in response to the deactivation of the write driver enable signal DTCP to a logic low level. Thus, the write data WD and WDB is not applied to the lower data input/output line IO_1 and IOB_1.

Returning to FIG. 3, during the write operation in the data input/output line structure of this embodiment, the signal CAiB for selecting the lower bank group 104 is an inverted signal of the signal CAi for selecting the upper bank group 102. Therefore, the upper write driver 140 and the lower write driver 150 are not operated at the same time but are alternately activated and operated. By using the upper write driver 140 and the lower write driver 150, the write data WD and WDB is applied to a corresponding data input/output line, that is, the upper data input/output line IO__2 and IOB__2 or the lower data input/output line IO__1 and IOB__1 according to the signals CAi and CAiB used for selecting a corresponding bank group.

During the write operation, the write data WD and WDB transmitted to the upper write driver 140 is transmitted to the upper data input/output line selector 132 of FIG. 4 via the auxiliary data input/output line IO__2p and IOB__2p in response to the activation of both the upper bank group selection signal CAi and the write driver enable signal DTCP to a logic high level. The upper data input/output line selector 132 of FIG. 4 connects the auxiliary data input/output line IO__2p and IOB__2p to the upper data input/output line IO__2 and IOB__2 in response to the activation of the write driver enable signal DTCP to a logic high level. Thereafter, the write data WD and WDB applied to the upper data input/output line IO__2 and IOB__2 is written to a memory cell through the input/output control circuits 120 through 123 for selecting the memory cell within one of the upper banks 110 through 113 in the upper bank group 102. At this time, the lower bank group selection signal CAiB is deactivated to a logic low level so that the lower write driver 150 is not activated.

Alternatively, the write data WD and WDB, which is transmitted by the lower write driver 150 in response to the activation of the lower bank group selection signal CAiB and the write driver enable signal DTCP to a logic high level, is applied to the lower data input/output line IO__1 and IOB__1. In response to the activation of the write driver enable signal DTCP to a logic high level, the upper/lower data input/output line connector 134 in the switch 130 divides the data input/output line IO and IOB into the upper data input/output line IO__2 and IOB__2 and the lower data input/output line IO__1 and IOB__1. Therefore, the write data WD and WDB applied to the lower data input/output line IO__1 and IOB__1 is not transmitted to the upper data input/output line IO__2 and IOB__2 and written to a memory cell through the input/output control circuits 124 through 127 for selecting the memory cell in one of the lower banks 114 through 117 in the lower bank group 104. At this time, the upper bank group selection signal CAi is deactivated to a logic low level so that the upper write driver 140 is not activated.

Consequently, in the data input/output line structure of this embodiment, during the write operation, the data input/output line IO and IOB is divided into the upper data input/output line IO__2 and IOB__2 and the lower data input/output line IO__1 and IOB__1 and each of the upper data input/output line IO__2 and IOB__2 and the lower data input/output line IO__1 and IOB__1 is separately shared by the corresponding banks. In other words, the upper data input/output line IO__2 and IOB__2 is shared by the banks 110 through 113 in the upper bank group 102 and the lower data input/output line IO__1 and IOB__1 is shared by the banks 114 through 117 in the lower bank group 104.

Figure 2:
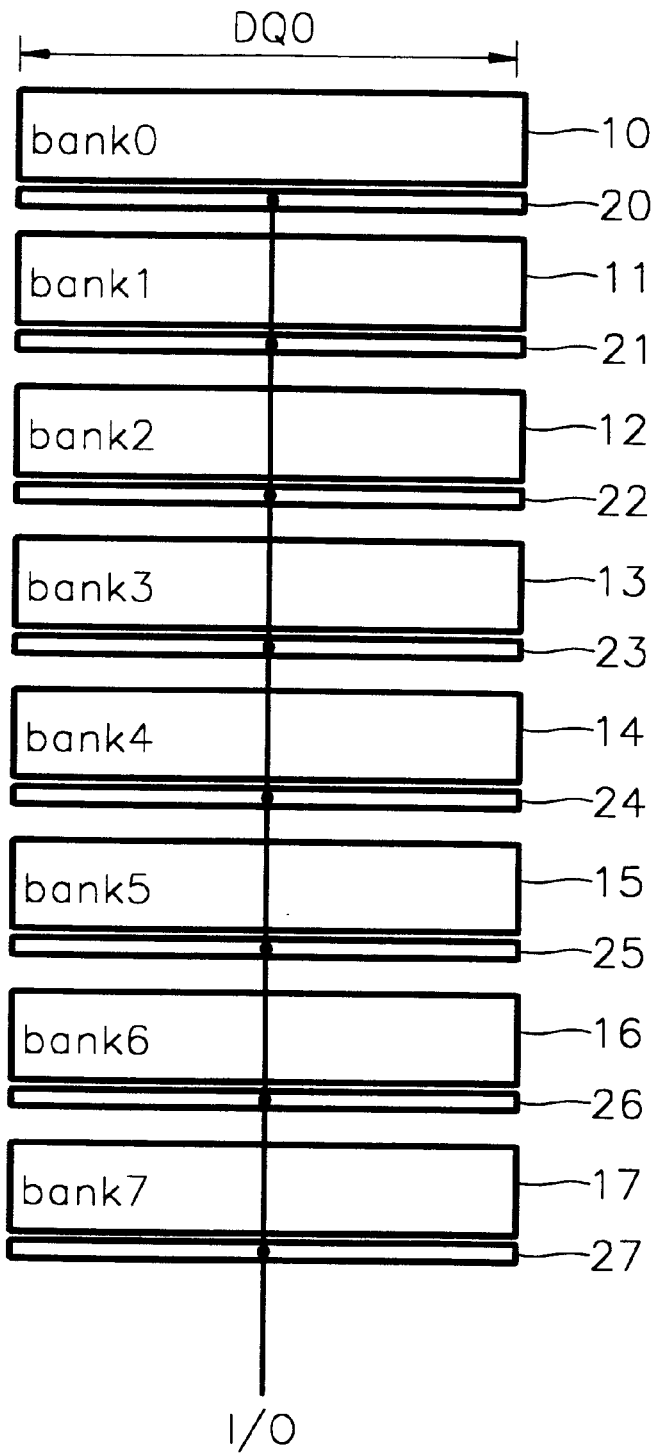
FIG. 2 contains a schematic diagram which illustrates a conventional semiconductor memory device having a plurality of banks sharing a data input/output line.

Compared with the conventional data input/output line I/O which is shared by all the banks 10 through 17 in the memory block DQ0 and has a large junction load as shown in FIG. 2, the data input/output line IO and IOB of the present invention is divided into the upper data input/output line IO__2 and IOB__2 and the lower data input/output line IO__1 and IOB__1, thereby having half the junction load of the conventional data input/output line I/O. Since data is written to a memory cell in a corresponding bank group 102 or 104 via the upper input/output line IO__2 and IOB__2 or the lower data input/output line IO__1 and IOB__1 which has the reduced junction load, reduction of speed can be minimized.

Figure 7:
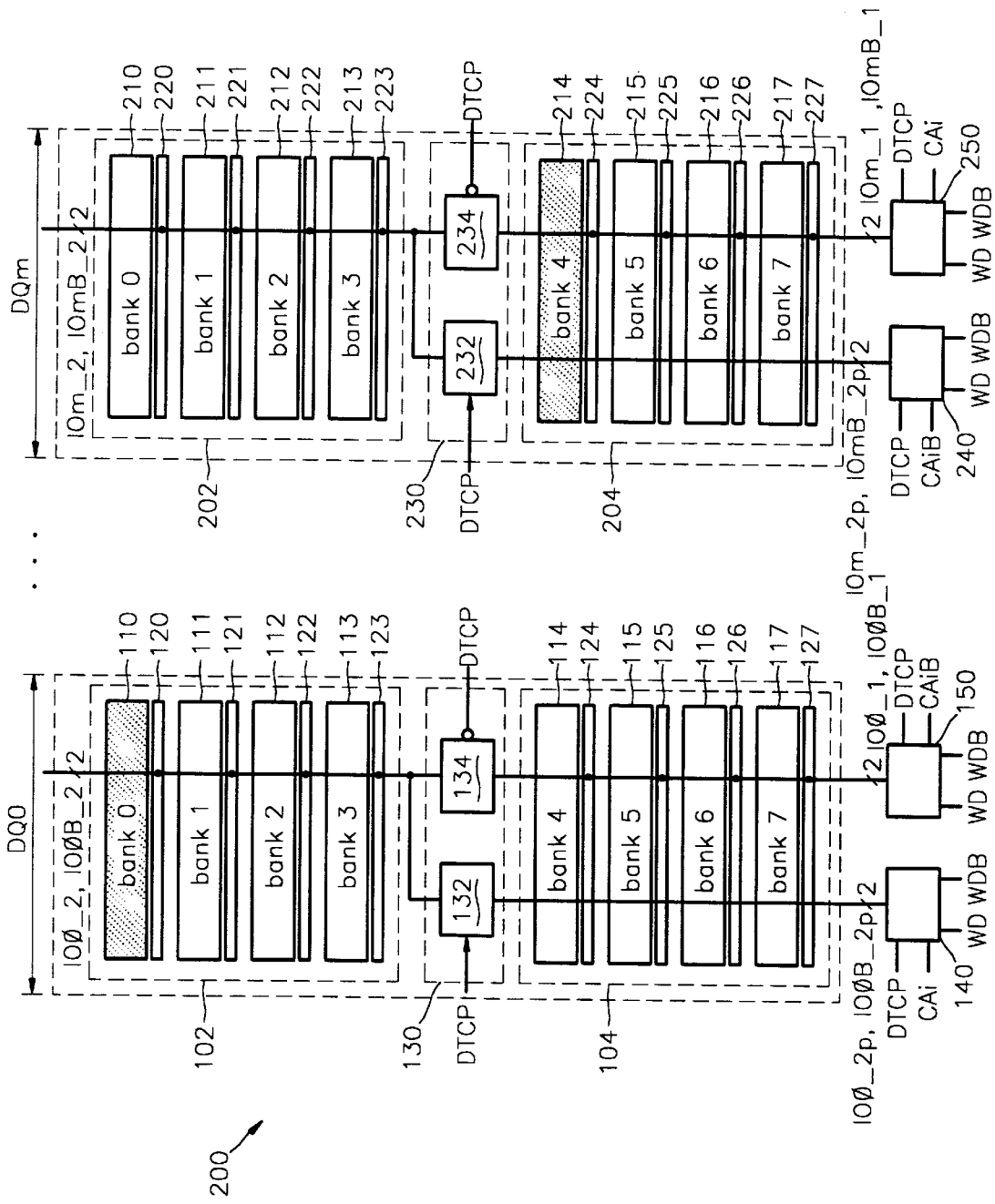
FIG. 7 contains a schematic diagram which illustrates a semiconductor memory device employing the data input/output line structure of FIG. 3.

FIG. 7 shows a semiconductor memory device to which the data input/output line structure of FIG. 3 can be applied. Referring to FIG. 7, a semiconductor memory device 200 operates in a similar manner as the semiconductor memory device 100 of FIG. 3. In the semiconductor memory device 100, the upper or lower bank group in the DQ block is selected by a single address CAiB and CAi. However, in the semiconductor memory device 200 shown in FIG. 7, including a plurality of DQ blocks DQ0 through DQm, an address CAiB and CAi for selecting either an upper or a lower bank group 202 or 204 in the DQm block is applied in the reverse manner to an address CAiB and CAi for selecting the upper or lower bank group 102 or 104 in the DQ0 block, such that the upper or lower bank groups 102 and 202 or 104 and 204 in the DQ0 and DQm blocks are alternately selected.

In the semiconductor memory device 200, during the write operation, once one of the banks 110 through 113 in the upper bank group 102 within the DQ0 block is selected, one of the banks 214 through 217 in the lower bank group 204 is selected in the DQm block. For example, the semiconductor memory device 200 is designed such that, when a memory cell of the bank 110 in the upper bank group 102 within the DQ0 block is selected, a memory cell of the bank 214 in the lower bank group 204 within the DQm block is selected. In this case, instead of the bank 214, the bank 217 can be selected in the DQm block. This is for regulating line loads to some extent in view of data line sense amplifiers (not shown) and data line drivers (not shown) which are connected to data input/output lines IO0 and IO0B through IOm and IOmB. Similarly, when one of the banks 114 through 117 belonging to the lower bank group 104 within the DQ0 block is selected, one of the banks 210 through 213 belonging to the upper bank group 202 is selected in the DQm block.

As described above, memory cells belonging to different bank groups in different DQ blocks are selected in the semiconductor memory device 200 during the write operation. Accordingly, when a memory cell in a bank distant from the upper write driver 140 is selected in the DQ0 block, a memory cell in a bank close to the lower write driver 250 is selected in another DQm block. Therefore, line loads are regulated to some extent in view of the data line sense amplifiers and the data line drivers which are connected to the data input/output lines IO0 and IO0B through IOm and IOmB.

Provided that banks most distant from the write drivers 140, 150, 240 and 250, for example, the banks 110 and 210 are selected in one case, and banks closest to the write drivers 140, 150, 240 and 250, for example, the banks 117 and 217, are selected in the other case in both DQ0 and DQm blocks, the line loads in view of the data line sense amplifiers and the data line drivers in the two cases are greatly different, thereby causing load imbalance of the data input/output line. This load imbalance increases variation in power consumption, thereby causing a noise phenomenon in which a voltage level of a power supply line drops. The data input/output line structure in this embodiment of the present invention prevents such power supply noise by regulating line loads.

Each of the data input/output lines IO0 and IO0B and IOm and IOmB in the semiconductor memory device 200 of the present invention has only the load of one bank group, that is, the upper bank group 102 or 202 or the lower bank group 104 or 204 so that the line load of each data input/output line is reduced by ½ compared with a conventional data input/output line which is connected to all banks as a whole during the write operation. Consequently, power consumption is reduced during the write operation of a semiconductor memory device according to the present invention.

In this embodiment, the semiconductor memory device 200 is described as having two DQ blocks DQ0 and DQm. However, it will be understood that a semiconductor memory device may include more DQ blocks and banks including selected cells in the different DQ blocks belong to different bank groups. A semiconductor memory device of the present invention is designed such that memory cells selected in one group of DQ blocks belong to upper bank groups and memory cells selected in the other group of DQ blocks belong to lower bank groups. In addition, the upper bank groups in one group of DQ blocks and the lower bank groups in the other group of DQ blocks may be alternately selected in each DQ block or alternately selected in each group of DQ blocks.

Figure 8:
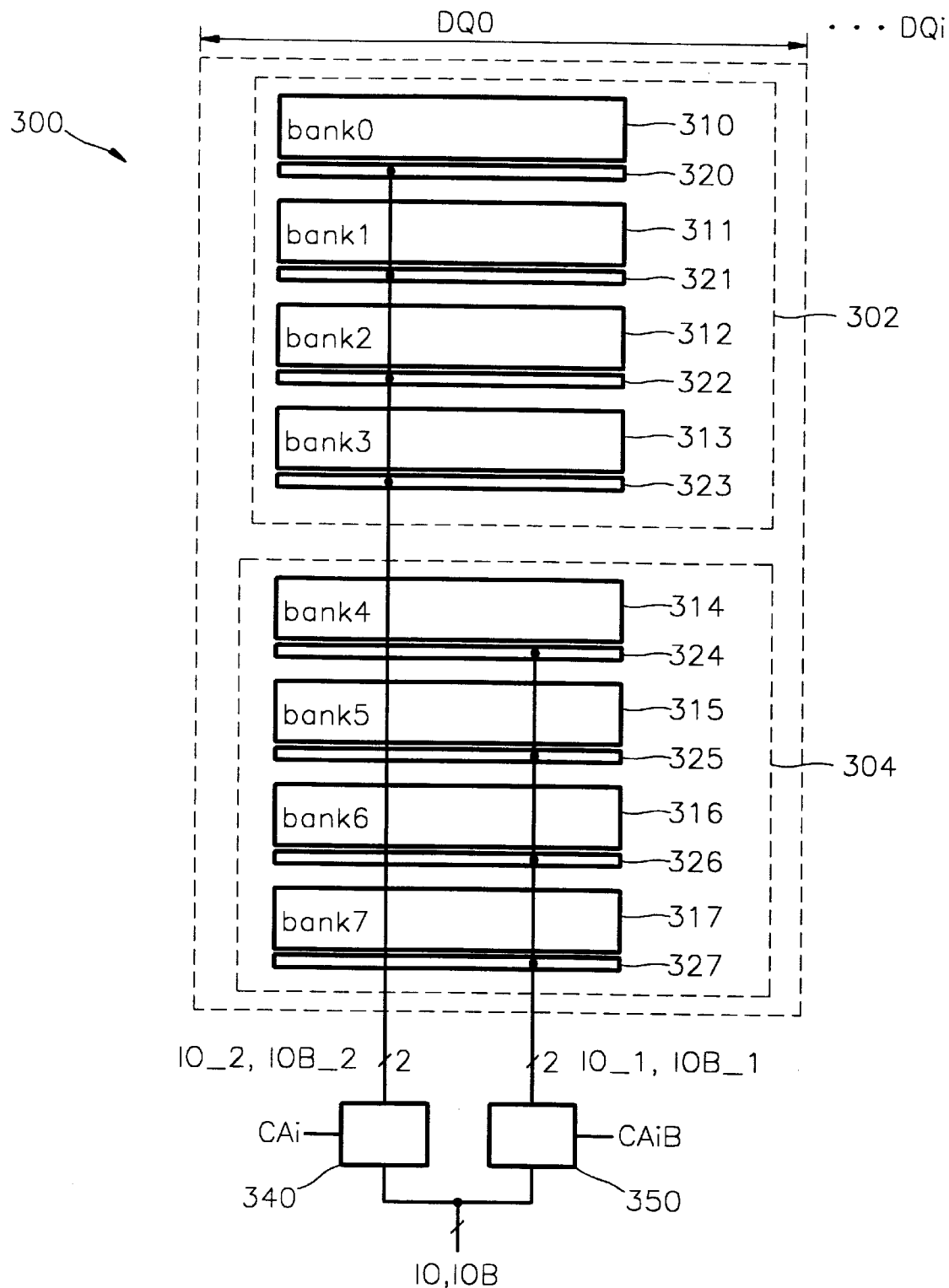
FIG. 8 contains a schematic diagram which illustrates a semiconductor memory device having a data input/output line structure according to a second embodiment of the present invention.

FIG. 8 shows a semiconductor memory device having a data input/output line structure according to another embodiment of the present invention. Referring to FIG. 8, in a semiconductor memory device 300, a plurality of banks 310 through 317 in a DQ0 block are grouped into an upper bank group 302 and a lower bank group 304. The banks 310 through 313 in the upper bank group 302 share an upper data input/output line IO_2 and IOB_, and the banks 314 through 317 in the lower bank group 304 share a lower data input/output line IO_1 and IOB_1. The upper data input/output line IO_2 and IOB_2 and the lower data input/output line IO_1 and IOB_1 are respectively connected to a data input/output line IO and IOB through switches 340 and 350, respectively.

Figure 9:
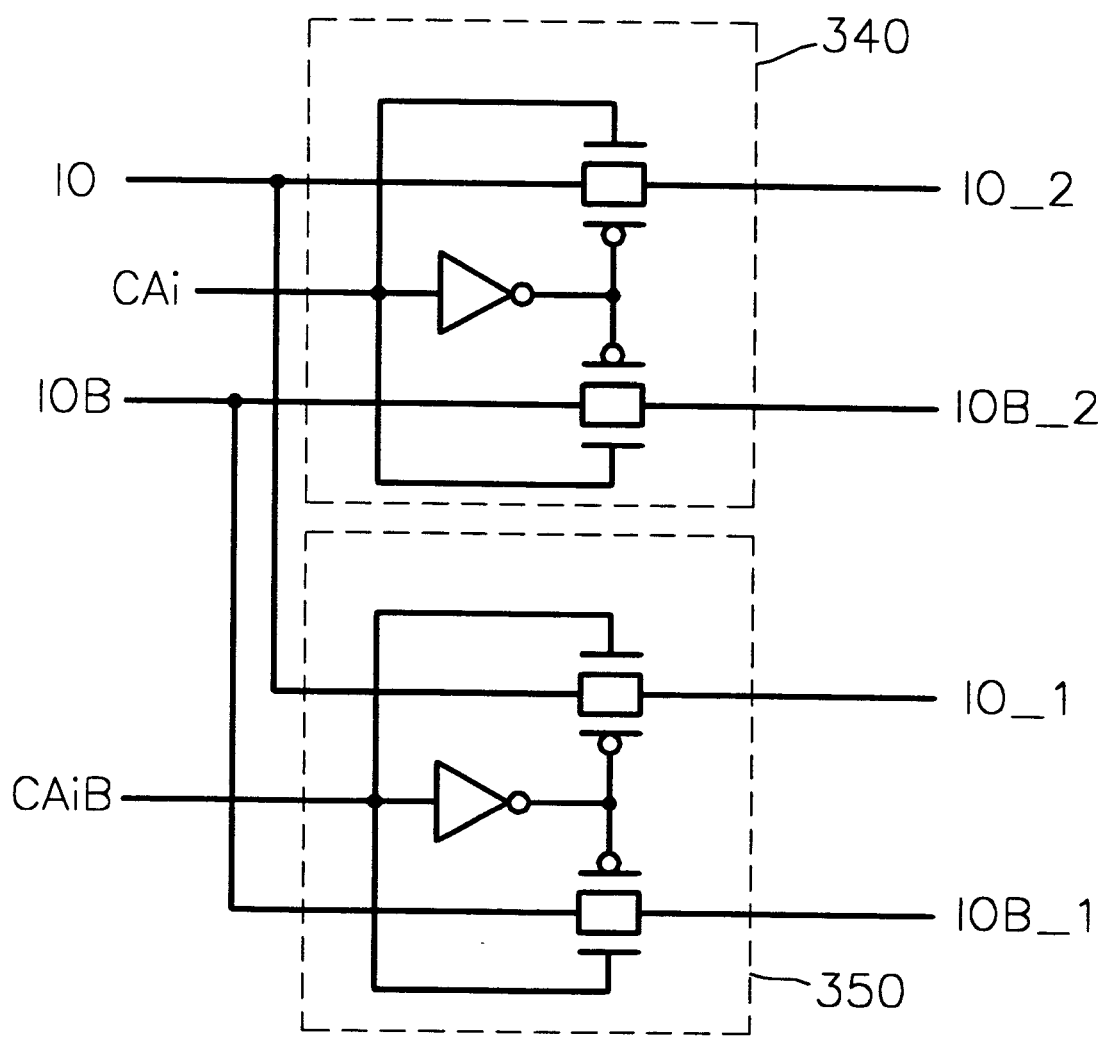
FIG. 9 contains a schematic diagram which illustrates one embodiment of a switch unit shown FIG. 8.

Referring to FIG. 9, the switch 340 connects the data input/output line IO and IOB to the upper data input/output line IO_2 and IOB_2 in response to the activation of an upper bank group selection signal CAi to a logic high level. The switch 350 connects the data input/output line IO and IOB to the lower data input/output line IO_1 and IOB_1 in response to the activation of a lower bank group selection signal CAiB to a logic high level. As previously described in connection with FIG. 3, the lower bank group selection signal CAiB is an inverted signal of the upper bank group selection signal CAi. Accordingly, the data input/output line IO and IOB is alternately connected to the upper data input/output line IO_2 and IOB_2 and the lower data input/output line IO1 and IOB_1 according to the bank group selection signals CAi and CAiB.

According to the data input/output line structure of FIG. 8, data is written to or read from a memory cell in a corresponding bank group through an upper or a lower data input/output line separately connected to the data input/output line IO and IOB. The data input/output line structure of FIG. 8 is different from the data input/output line structure of FIG. 3 in which a data input/output line is divided into upper and lower data input/output lines during the write operation and the upper and lower data input/output lines are connected during the read operation. The data input/output line structure in the second embodiment decreases the load of a data input/output line during the read operation as well as the write operation, thereby minimizing reduction of speed and power consumption.

Figure 10:
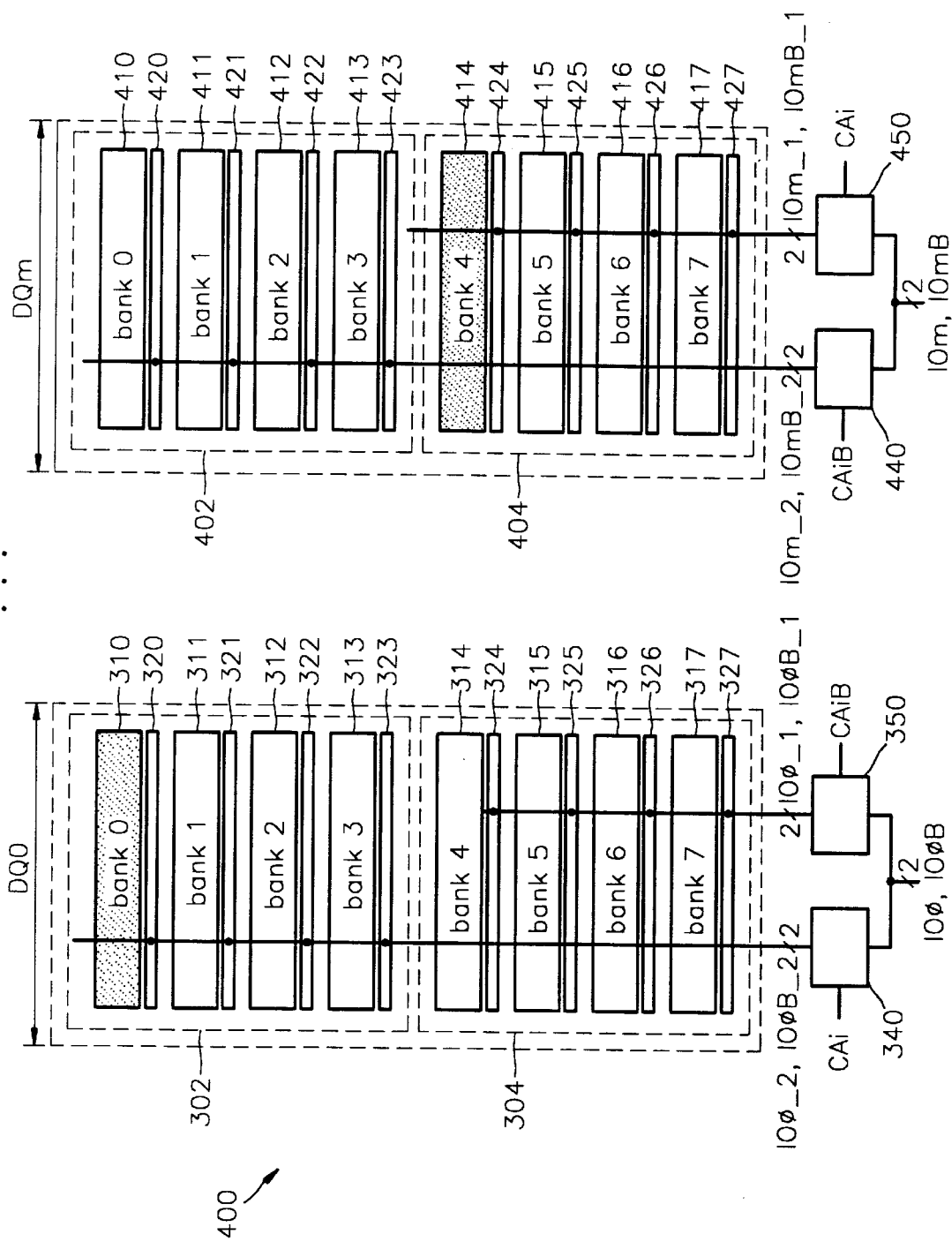
FIG. 10 contains a schematic diagram which illustrates a semiconductor memory device employing the data input/output line structure of FIG. 8.

FIG. 10 shows a semiconductor memory device to which the data input/output line structure of FIG. 8 can be applied.

The semiconductor memory device 400 shown in FIG. 10 performs in a similar manner to the semiconductor memory device 200 described in FIG. 7. In the semiconductor memory device 200 of FIG. 7, a data input/output line is divided into upper and lower data input/output lines during the write operation, and the upper and the lower data input/output lines are connected during the read operation. In the semiconductor memory device 400 according to the second embodiment, both write and read operations are performed in a state in which the upper and lower data input/output lines are divided. Thus, a description of the specific operations of the semiconductor memory device 400 according to the second embodiment is omitted to avoid redundancy.

In the semiconductor memory device 400, a data input/output line IO0 and IO0B is connected to an upper data input/output line IO0_2 and IO0B_2 in a DQ0 block and a data input/output line IOm and IOmB is connected to a lower data input/output line lOm_1 and IOmB_1 in a DQm block in response to a signal for selecting an upper bank group in the DQ block DQ0. Accordingly, as previously described in connection with FIG. 7, line loads become uniform in view of data line sense amplifiers (not shown) and data line drivers (not shown) which are respectively connected to the data input/output lines IO0 and IO0B and IOm and IOmB, thereby preventing power supply noise.

While this invention has been particularly shown and described with reference to the preferred embodiments thereof, it will be understood by those skilled in the art that various changes in form and details may be made therein without departing from the spirit and scope of the invention as defined by the appended claims.

What is claimed is:

1. A semiconductor memory device having a memory block including a plurality of banks sharing a data input/output line pair, wherein data of a selected memory cell in the memory block is transferred via the data input/output line pair, the memory block includes at least two bank groups during a write operation in which data is written to the memory cell, the data input/output line pair is divided into at least two data input/output lines connected to the at least two bank groups, respectively, and the data is written to the memory cell via the data input/output line connected to a bank group that includes the selected memory cell.

2. The semiconductor memory device of claim 1, wherein the data input/output lines are connected to each other while data is being read from the memory cell.

3. The semiconductor memory device of claim 1, wherein the banks are grouped into the bank groups by a predetermined address.

4. A semiconductor memory device having a memory block including a plurality of banks sharing a data input/output line pair, wherein data of a selected memory cell in the memory block is transferred via the data input/output line pair, the semiconductor memory device comprising:
a switch for grouping the banks into upper and lower bank groups and dividing the data input/output line pair into an upper data input/output line and a lower data input/output line to separately connect the upper and lower data input/output lines to the upper and lower bank groups, respectively, while data is being written to the memory block, and for connecting the upper and lower data input/output lines to allow the banks to share the data input/output line pair while data is being read from the memory block;
an upper write driver for applying write data to the upper data input/output line connected to the upper bank group when a memory cell of the upper bank group is selected during the write operation; and a lower write driver for applying the write data to the lower data input/output line connected to the lower bank group when a memory cell of the lower bank group is selected during the write operation.

5. The semiconductor memory device of claim 4, wherein the write data is applied to the upper data input/output line via an auxiliary data input/output line by the upper write driver when writing the data in the memory cell in the upper bank group and write data is applied to the lower data input/output line by the lower write driver when writing data to the memory cell in the lower bank group, whereby the write data is written in the memory cell in the corresponding bank group.

6. The semiconductor memory device of claim 4, wherein the switch comprises:

an upper data input/output line selector for applying write data from the upper write driver to the upper data input/output line in response to a write driver enable signal during the write operation; and an upper/lower data input/output line connector for disconnecting the lower data input/output line from the upper data input/output line in response to the write driver enable signal during the write operation and connecting the lower data input/output line to the upper data input/output line in response to a write driver enable signal during the read operation.

7. The semiconductor memory device of claim 4, wherein the upper write driver applies write data to the upper data input/output line through the switch in response to a write driver enable signal instructing the write operation and a signal for selecting the upper bank group.

8. The semiconductor memory device of claim 4, wherein the lower write driver applies write data to the lower data input/output line through the switch in response to a write driver enable signal instructing the write operation and a signal for selecting the lower bank group.

9. A semiconductor memory device having at least two memory blocks each comprising a plurality of banks, wherein at least two banks are selected from the plurality of banks in different memory blocks and data of a selected memory cell in each memory block is transferred via a data input/output line pair, the semiconductor memory device comprising:

a switch in each memory block for dividing the memory block into upper and lower bank groups and dividing a data input/output line pair into upper and lower data input/output lines to separately connect the upper and lower data input/output lines to the respective upper and lower bank groups during write operation, and for connecting the upper and lower data input/output lines to allow the banks in the corresponding memory block to share the data input/output line pair during read operation;

an upper write driver in each memory block for applying write data to a corresponding upper data input/output line connected to a corresponding upper bank group when a memory cell of the upper bank group is selected during the write operation; and a lower write driver in each memory block, for applying the write data to a corresponding lower data input/output line connected to the corresponding lower bank group when a memory cell of the lower bank group is selected during the write operation, wherein the selected banks belong to different bank groups in different memory blocks.

10. The semiconductor memory device of claim 9, wherein one of the selected banks belongs to the upper bank group in one memory block and is distant from the corresponding upper write driver and another bank belongs to the lower bank group in another memory block and is close to the corresponding lower write driver.

11. A semiconductor memory device including a plurality of memory blocks each having a plurality of banks sharing a data input/output line pair, wherein data of each selected memory cell in each memory block is input and output through each data input/output line pair, each memory block is divided into at least two upper and lower bank groups, each data input/output line pair is divided into at least two upper and lower input/output lines to separately connect the upper and lower bank groups in each memory block to each corresponding data input/output line, and memory cells are alternately selected such that memory cells selected in one group of memory blocks belong to upper bank groups when memory cells selected in the other group of memory blocks belong to lower bank groups, whereby data transmitted through each data input/output line pair is written in each selected memory cell through the corresponding upper or lower data input/output line connected to the bank group including the selected memory cell during write operation.

12. The semiconductor memory device of claim 11, wherein the upper and lower data input/output lines in each memory block are connected during a read operation so that data of a selected memory cell is read and transmitted via the connected upper and lower data input/output lines to a corresponding data input/output line pair.

13. The semiconductor memory device of claim 11, wherein the upper bank groups in one group of memory blocks and the lower bank groups in the other group of memory blocks are alternately selected in units of individual memory blocks or groups of memory blocks.

14. A semiconductor memory device having a memory block including a plurality of banks sharing a data input/output line pair, wherein data of a selected memory cell in the memory block is transferred via the data input/output line pair, the memory block is divided into at least two upper and lower bank groups, the data input/output line pair is divided into at least two upper and lower data input/output lines to separately connect the data input/output line pair to the upper and lower bank groups, respectively, and the lower data input/output line is not extended to the upper bank group, whereby the upper and lower bank groups independently operate such that data input or to be output via the data input/output line pair is written or read in or from the selected memory cell via the upper or lower data input/output line connected to a bank group including the selected memory cell.

15. A semiconductor memory device including a plurality of memory blocks each having a plurality of banks sharing a data input/output line pair, wherein data of each selected memory cell in each memory block is input and output through each data input/output line pair, each memory block is divided into at least two upper and lower bank groups, each data input/output line is divided into at least two upper and lower input/output lines, the lower input/output line is not extended to the upper bank group in each memory block, and memory cells are alternately selected such that selected memory cells in one group of memory blocks belong to upper bank groups when selected memory cells in the other group of memory blocks belong to lower bank groups, whereby the upper and lower bank groups in each memory block independently operate such that data input or to be output via a corresponding data input/output line pair is written or read in or from a selected memory cell via the upper or lower data input/output line connected to the upper or lower bank group including the selected memory cell.

16. The semiconductor memory device of claim 15, wherein the upper bank groups in one group of memory blocks and the lower bank groups in the other group of memory blocks are alternately selected in units of individual memory blocks or groups of memory blocks.

17. The semiconductor memory device of claim 15, wherein each selected bank in the upper bank groups of one group of memory blocks is distant from each corresponding upper write driver when each selected bank in the lower bank groups of the other group of memory blocks is close to each corresponding lower write driver.

* * * * *